United States Patent
Vasilache et al.

(10) Patent No.: US 9,799,339 B2
(45) Date of Patent: Oct. 24, 2017

(54) STEREO AUDIO SIGNAL ENCODER

(75) Inventors: Adriana Vasilache, Tampere (FI);
Lasse Juhani Laaksonen, Nokia (FI);
Anssi Sakari Rämö, Tampere (FI)

(73) Assignee: Nokia Technologies Oy, Espoo (FI)

( * ) Notice: Subject to any disclaimer, the term of this patent is extended or adjusted under 35 U.S.C. 154(b) by 75 days.

(21) Appl. No.: 14/402,113

(22) PCT Filed: May 29, 2012

(86) PCT No.: PCT/IB2012/052668
§ 371 (c)(1),
(2), (4) Date: Mar. 22, 2015

(87) PCT Pub. No.: WO2013/179084
PCT Pub. Date: Dec. 5, 2013

(65) Prior Publication Data
US 2016/0027445 A1    Jan. 28, 2016

(51) Int. Cl.
*G10L 19/008* (2013.01)
*H04S 1/00* (2006.01)
*G10L 19/035* (2013.01)
*H03M 7/40* (2006.01)

(52) U.S. Cl.
CPC .......... *G10L 19/008* (2013.01); *G10L 19/035* (2013.01); *H04S 1/007* (2013.01); *H03M 7/4075* (2013.01); *H04S 2420/03* (2013.01)

(58) Field of Classification Search
None
See application file for complete search history.

(56) References Cited

U.S. PATENT DOCUMENTS

| | | | |
|---|---|---|---|
| 2007/0008193 A1* | 1/2007 | Liebchen | G10L 19/12 341/50 |
| 2007/0016406 A1* | 1/2007 | Thumpudi | G10L 19/008 704/205 |
| 2008/0212726 A1 | 9/2008 | Pang et al. | |
| 2008/0215340 A1 | 9/2008 | Su et al. | |

(Continued)

FOREIGN PATENT DOCUMENTS

| | | |
|---|---|---|
| CN | 101086845 A | 12/2007 |
| CN | 101188878 A | 5/2008 |
| CN | 101411214 A | 4/2009 |

(Continued)

OTHER PUBLICATIONS

Faller, Christof, and Frank Baumgarte. "Binaural cue coding—Part II: Schemes and applications." IEEE Transactions on Speech and Audio Processing 11.6 (2003): 520-531.*

Office action received for corresponding Korean Patent Application No. 2014-7036555, dated Sep. 7, 2015, 5 pages of office action and no pages of office action translation available.

Extended European Search Report received for corresponding European Patent Application No. 12877930.3, dated Jan. 14, 2016, 7 pages.

Office action received for corresponding Chinese Patent Application No. 201280074922.6, dated Mar. 4, 2016, 9 pages of office action and no pages of office action translation available.

(Continued)

*Primary Examiner* — Curtis Kuntz
*Assistant Examiner* — Kenny Truong
(74) *Attorney, Agent, or Firm* — Alston & Bird LLP

(57) ABSTRACT

An apparatus comprising a mapper configured to map an instance of a parameter according to a first mapping to generate a first mapped instance; a remapper configured to remap the first mapped instance dependent on the frequency distribution of mapped instances to generate a remapped instance with an associated order position; and an encoder configured to encode the remapped instance dependent on an order position of the remapped instance.

16 Claims, 13 Drawing Sheets

(56) References Cited

U.S. PATENT DOCUMENTS

2009/0228284 A1    9/2009   Moon et al.
2013/0226594 A1*   8/2013   Fuchs ................ G10L 19/0017
                                                                                        704/500

FOREIGN PATENT DOCUMENTS

| EP | 1575032 A2 | 9/2005 |
|---|---|---|
| EP | 1853092 | 11/2007 |
| EP | 2077550 | 7/2009 |
| KR | 2007-0031213 A | 3/2007 |
| KR | 2007-0061882 A | 6/2007 |
| KR | 2009-0087902 A | 8/2009 |
| WO | 2006111294 | 10/2006 |
| WO | 2011/029984 A1 | 3/2011 |

OTHER PUBLICATIONS

Malvar, "Adaptive Run-Length / Golomb-Rice Encoding of Quantized Generalized Gaussian Sources with Unknown Statistics", Proceedings of the Data Compression Conference, Mar. 28-30, 2006, 10 pages.

International Search Report and Written Opinion received for corresponding Patent Cooperation Treaty Application No. PCT/IB2012/052668 , dated May 8, 2013, 15 pages.

Office action received for corresponding Chinese Patent Application No. 201280074922.6, dated Sep. 27, 2016, 4 pages of office action and no pages of office action translation available.

\* cited by examiner

STEREO AUDIO SIGNAL ENCODER

RELATED APPLICATION

This application was originally filed as PCT Application No. PCT/IB2012/052668 filed May 29, 2012.

FIELD

The present application relates to a stereo audio signal encoder, and in particular, but not exclusively to a stereo audio signal encoder for use in portable apparatus.

BACKGROUND

Audio signals, like speech or music, are encoded for example to enable efficient transmission or storage of the audio signals.

Audio encoders and decoders (also known as codecs) are used to represent audio based signals, such as music and ambient sounds (which in speech coding terms can be called background noise). These types of coders typically do not utilise a speech model for the coding process, rather they use processes for representing all types of audio signals, including speech. Speech encoders and decoders (codecs) can be considered to be audio codecs which are optimised for speech signals, and can operate at either a fixed or variable bit rate.

An audio codec can also be configured to operate with varying bit rates. At lower bit rates, such an audio codec may be optimized to work with speech signals at a coding rate equivalent to a pure speech codec. At higher bit rates, the audio codec may code any signal including music, background noise and speech, with higher quality and performance. A variable-rate audio codec can also implement an embedded scalable coding structure and bitstream, where additional bits (a specific amount of bits is often referred to as a layer) improve the coding upon lower rates, and where the bitstream of a higher rate may be truncated to obtain the bitstream of a lower rate coding. Such an audio codec may utilize a codec designed purely for speech signals as the core layer or lowest bit rate coding.

An audio codec is designed to maintain a high (perceptual) quality while improving the compression ratio. Thus instead of waveform matching coding it is common to employ various parametric schemes to lower the bit rate. For multichannel audio, such as stereo signals, it is common to use a larger amount of the available bit rate on a mono channel representation and encode the stereo or multichannel information exploiting a parametric approach which uses relatively fewer bits.

SUMMARY

There is provided according to a first aspect a method comprising: mapping an instance of a parameter according to a first mapping to generate a first mapped instance; remapping the first mapped instance dependent on the frequency distribution of mapped instances to generate a remapped instance with an associated order position; and encoding the remapped instance dependent on an order position of the remapped instance.

The parameter may be a difference between at least two channel audio signals.

The parameter may comprise at least one of: an interaural time difference; and an interaural level difference.

Mapping the instance of the parameter according to a first mapping may comprise scalar quantizing the instance of the parameter.

Mapping the instance of the parameter according to a first mapping may comprise ordering the scalar quantized output instance according to a predetermined map.

The predetermined map may be an expected decreasing frequency distribution order mapping for the parameter.

The method may further comprise determining a frequency distribution for a group of first mapped instances.

Determining a frequency distribution for a group of first mapped instances may comprise: receiving for each of the group of first mapped instances the first mapped instance value; increasing a count value associated with the first mapped instance value; and decreasing a count value associated with instance values other than the first mapped instance value.

The group may be at least two sub-bands representing an audio frame, wherein the instances of the parameter are sub-band instances of the parameter.

Receiving the first mapped instance value may comprise receiving in decreasing frequency sub-band order the first mapped instance value.

Increasing a count value associated with the first mapped instance value may comprise increasing the count value by 1.

Decreasing a count value associated with values other than the first mapped instance value may comprising multiplying the count values associated with mapped instance values other than the first mapped instance value by 0.9.

Remapping the first mapped instance dependent on the frequency distribution of first mapped instances to generate a remapped instance may comprise determining the order position associated with the instance of the parameter according to the count value associated with the mapped instance.

Encoding the remapped instance dependent on an order position of the remapped instance may comprise applying a Golomb-Rice encoding to the remapped instance dependent on the remapped instance order position.

The method may further comprise: receiving at least two audio channels; determining at least one parameter associated with a difference between the at least two audio channels; generating a single channel representation of the at least two audio channels dependent on the at least one parameter; and encoding the single channel representation.

The method may further comprise: multiplexing the encoded single channel representation and the encoded remapped instance to generate an encoded multichannel audio signal; and outputting the encoded multichannel audio signal.

According to a second aspect there is provided a method comprising: decoding from a first part of a signal a parameter instance; and remapping the parameter instance to generate a remapped parameter instance, wherein the remapping is dependent on the frequency distribution of remapped parameter instances.

Decoding from a first part of a signal a parameter instance may comprise decoding a first part of a signal using a Golomb-Rice decoding.

The method may further comprise determining the frequency distribution of the parameter instances.

Determining the frequency distribution of the parameter instances may comprise maintaining a count of the remapped parameter instances for a group of the remapped parameter instances.

The method may further comprise receiving the signal, wherein the signal is an encoded multichannel audio signal.

Remapping the parameter instances may comprise: determining an inverse mapping dependent on a decreasing occurrence order mapping for the frequency distribution of remapped parameter instances; and applying the inverse mapping.

The method may further comprise dequantizing the remapped parameter instance to generate a stereo parameter value.

The stereo parameter value may be at least one of: an interaural time difference; and an interaural level difference.

According to a third aspect there is provided an apparatus comprising at least one processor and at least one memory including computer program code for one or more programs, the at least one memory and the computer program code configured to, with the at least one processor, cause the apparatus at least to perform: mapping an instance of a parameter according to a first mapping to generate a first mapped instance; remapping the first mapped instance dependent on the frequency distribution of mapped instances to generate a remapped instance with an associated order position; and encoding the remapped instance dependent on an order position of the remapped instance.

The parameter may be a difference between at least two channel audio signals.

The parameter may comprise at least one of: an interaural time difference; and an interaural level difference.

Mapping the instance of the parameter according to a first mapping may cause the apparatus to perform scalar quantizing the instance of the parameter.

Mapping the instance of the parameter according to a first mapping may cause the apparatus to perform ordering the scalar quantized output instance according to a predetermined map.

The predetermined map may be an expected decreasing frequency distribution order mapping for the parameter.

The apparatus may be further caused to perform determining a frequency distribution for a group of first mapped instances.

Determining a frequency distribution for a group of first mapped instances may cause the apparatus to perform: receiving for each of the group of first mapped instances the first mapped instance value; increasing a count value associated with the first mapped instance value; and decreasing a count value associated with instance values other than the first mapped instance value.

The group may be at least two sub-bands representing an audio frame, wherein the instances of the parameter are sub-band instances of the parameter.

Receiving the first mapped instance value may cause the apparatus to perform receiving in decreasing frequency sub-band order the first mapped instance value.

Increasing a count value associated with the first mapped instance value may cause the apparatus to perform increasing the count value by 1.

Decreasing a count value associated with values other than the first mapped instance value may cause the apparatus to perform multiplying the count values associated with mapped instance values other than the first mapped instance value by 0.9.

Remapping the first mapped instance dependent on the frequency distribution of first mapped instances to generate a remapped instance may cause the apparatus to perform determining the order position associated with the instance of the parameter according to the count value associated with the mapped instance.

Encoding the remapped instance dependent on an order position of the remapped instance may cause the apparatus to perform applying a Golomb-Rice encoding to the remapped instance dependent on the remapped instance order position.

The apparatus may be further caused to perform: receiving at least two audio channels; determining at least one parameter associated with a difference between the at least two audio channels; generating a single channel representation of the at least two audio channels dependent on the at least one parameter; and encoding the single channel representation.

The apparatus may be further caused to perform: multiplexing the encoded single channel representation and the encoded remapped instance to generate an encoded multichannel audio signal; and outputting the encoded multichannel audio signal.

According to a fourth aspect there is provided an apparatus comprising at least one processor and at least one memory including computer program code for one or more programs, the at least one memory and the computer program code configured to, with the at least one processor, cause the apparatus at least to perform: decoding from a first part of a signal a parameter instance; and remapping the parameter instance to generate a remapped parameter instance, wherein the remapping is dependent on the frequency distribution of remapped parameter instances.

Decoding from a first part of a signal a parameter instance may cause the apparatus to perform decoding a first part of a signal using a Golomb-Rice decoding.

The apparatus may be further caused to perform determining the frequency distribution of the parameter instances.

Determining the frequency distribution of the parameter instances may cause the apparatus to perform maintaining a count of the remapped parameter instances for a group of the remapped parameter instances.

The apparatus may be further caused to perform receiving the signal, wherein the signal may be an encoded multichannel audio signal.

Remapping the parameter instances may cause the apparatus to perform: determining an inverse mapping dependent on a decreasing occurrence order mapping for the frequency distribution of remapped parameter instances; and applying the inverse mapping.

The apparatus may be caused to perform dequantizing the remapped parameter instance to generate a stereo parameter value.

The stereo parameter value may be at least one of: an interaural time difference; and an interaural level difference.

According to a fifth aspect there is provided an apparatus comprising: means for mapping an instance of a parameter according to a first mapping to generate a first mapped instance; remapping the first mapped instance dependent on the frequency distribution of mapped instances to generate a remapped instance with an associated order position; and encoding the remapped instance dependent on an order position of the remapped instance.

The parameter may be a difference between at least two channel audio signals.

The parameter may comprise at least one of: an interaural time difference; and an interaural level difference.

The means for mapping the instance of the parameter according to a first mapping may comprise means for scalar quantizing the instance of the parameter.

The means for mapping the instance of the parameter according to a first mapping may comprise means for ordering the scalar quantized output instance according to a predetermined map.

The predetermined map may be an expected decreasing frequency distribution order mapping for the parameter.

The apparatus may further comprise means for determining a frequency distribution for a group of first mapped instances.

The means for determining a frequency distribution for a group of first mapped instances may comprise: means for receiving for each of the group of first mapped instances the first mapped instance value; means for increasing a count value associated with the first mapped instance value; and means for decreasing a count value associated with instance values other than the first mapped instance value.

The group may be at least two sub-bands representing an audio frame, wherein the instances of the parameter are sub-band instances of the parameter.

The means for receiving the first mapped instance value may comprise means for receiving in decreasing frequency sub-band order the first mapped instance value.

The means for increasing a count value associated with the first mapped instance value may comprise means for increasing the count value by 1.

The means for decreasing a count value associated with values other than the first mapped instance value may comprise means for multiplying the count values associated with mapped instance values other than the first mapped instance value by 0.9.

The means for remapping the first mapped instance dependent on the frequency distribution of first mapped instances to generate a remapped instance may comprise means for determining the order position associated with the instance of the parameter according to the count value associated with the mapped instance.

The means for encoding the remapped instance dependent on an order position of the remapped instance may comprise means for applying a Golomb-Rice encoding to the remapped instance dependent on the remapped instance order position.

The apparatus may comprise: means for receiving at least two audio channels; means for determining at least one parameter associated with a difference between the at least two audio channels; means for generating a single channel representation of the at least two audio channels dependent on the at least one parameter; and means for encoding the single channel representation.

The apparatus may comprise: means for multiplexing the encoded single channel representation and the encoded remapped instance to generate an encoded multichannel audio signal; and means for outputting the encoded multichannel audio signal.

According to a sixth aspect there is provided an apparatus comprising: means for decoding from a first part of a signal a parameter instance; and means for remapping the parameter instance to generate a remapped parameter instance, wherein the remapping is dependent on the frequency distribution of remapped parameter instances.

The means for decoding from a first part of a signal a parameter instance may comprise means for decoding a first part of a signal using a Golomb-Rice decoding.

The apparatus may further comprise means for determining the frequency distribution of the parameter instances.

The means for determining the frequency distribution of the parameter instances may comprise means for maintaining a count of the remapped parameter instances for a group of the remapped parameter instances.

The apparatus may comprise means for receiving the signal, wherein the signal may be an encoded multichannel audio signal.

The means for remapping the parameter instances may comprise: means for determining an inverse mapping dependent on a decreasing occurrence order mapping for the frequency distribution of remapped parameter instances; and means for applying the inverse mapping.

The apparatus may further comprise means for dequantizing the remapped parameter instance to generate a stereo parameter value.

The stereo parameter value may be at least one of: an interaural time difference; and an interaural level difference.

According to a seventh aspect there is provided an apparatus comprising: a mapper configured to map an instance of a parameter according to a first mapping to generate a first mapped instance; a remapper configured to remap the first mapped instance dependent on the frequency distribution of mapped instances to generate a remapped instance with an associated order position; and an encoder configured to encode the remapped instance dependent on an order position of the remapped instance.

The parameter may be a difference between at least two channel audio signals.

The parameter may comprise at least one of: an interaural time difference; and an interaural level difference.

The mapper may comprise a scalar quantizer configured to scalar quantize the instance of the parameter.

The mapper may comprise an order mapper configured to order the scalar quantized output instance according to a predetermined map.

The predetermined map may be an expected decreasing frequency distribution order mapping for the parameter.

The apparatus may further comprise a frequency distribution determiner configured to determine a frequency distribution for a group of first mapped instances.

The frequency distribution determiner may comprise: an input configured to receive for each of the group of first mapped instances the first mapped instance value; a count incrementer configured to increase a count value associated with the first mapped instance value; and a count decrementor configured to decrease a count value associated with instance values other than the first mapped instance value.

The group may be at least two sub-bands representing an audio frame, wherein the instances of the parameter are sub-band instances of the parameter.

The input may be configured to receive in decreasing frequency sub-band order the first mapped instance value.

The count incrementer may be configured to increase the count value by 1.

The count decrementor may be configured to multiply the count values associated with mapped instance values other than the first mapped instance value by 0.9.

The remapper may comprise an order position determiner configured to determine the order position associated with the instance of the parameter according to the count value associated with the mapped instance.

The encoder may comprise a Golomb-Rice encoder.

The apparatus may comprise: an audio input configured to receive at least two audio channels; an audio parameter determiner configured to determine at least one parameter associated with a difference between the at least two audio channels; a mono channel generator configured to generate a single channel representation of the at least two audio channels dependent on the at least one parameter; and mono channel encoder configured to encode the single channel representation.

The apparatus may comprise: a multiplexer configured to multiplex the encoded single channel representation and the encoded remapped instance to generate an encoded multichannel audio signal; and an output configured to output the encoded multichannel audio signal.

According to an eighth aspect there is provided an apparatus comprising: a decoder configured to decode from a first part of a signal a parameter instance; and a remapper configured to remap the parameter instance to generate a remapped parameter instance, wherein the remap is dependent on the frequency distribution of remapped parameter instances.

The decoder may comprise a Golomb-Rice decoder.

The apparatus may further comprise a frequency distribution determiner configured to determine the frequency distribution of the parameter instances.

The frequency distribution determiner may comprise a count updater configured to maintain a count of the remapped parameter instances for a group of the remapped parameter instances.

The apparatus may comprise an input configured to receive the signal, wherein the signal may be an encoded multichannel audio signal.

The remapper may comprise: an inverse map determiner configured to determine an inverse mapping dependent on a decreasing occurrence order mapping for the frequency distribution of remapped parameter instances; and an inverse map applier configured to apply the inverse mapping.

The apparatus may further comprise a dequantizer configured to dequantize the remapped parameter instance to generate a stereo parameter value.

The stereo parameter value may be at least one of: an interaural time difference; and an interaural level difference.

A computer program product may cause an apparatus to perform the method as described herein.

An electronic device may comprise apparatus as described herein.

A chipset may comprise apparatus as described herein.

BRIEF DESCRIPTION OF DRAWINGS

For better understanding of the present invention, reference will now be made by way of example to the accompanying drawings in which.

DESCRIPTION OF SOME EMBODIMENTS OF THE APPLICATION

Figure 1:
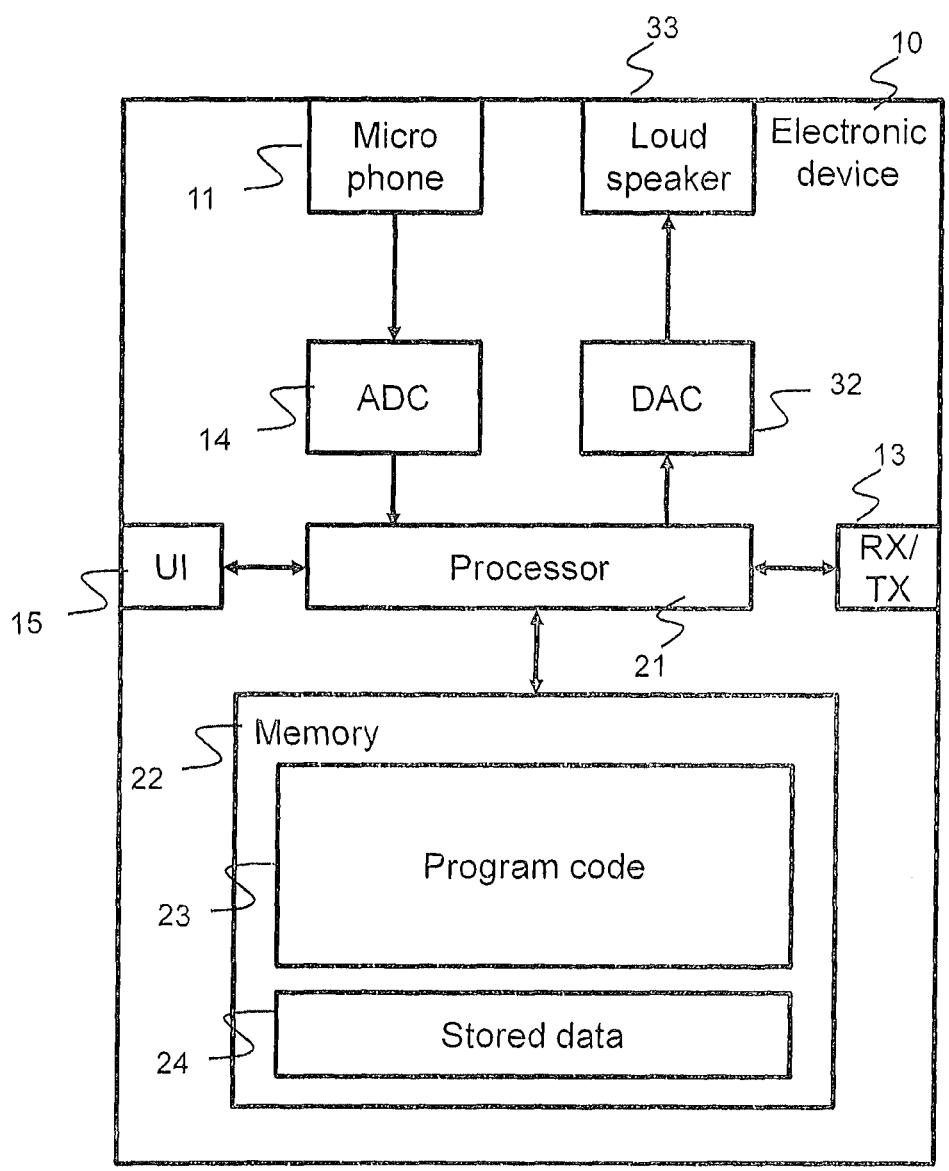
FIG. 1 shows schematically an electronic device employing some embodiments.

The following describes in more detail possible stereo and multichannel speech and audio codecs, including layered or scalable variable rate speech and audio codecs. In this regard reference is first made to FIG. 1 which shows a schematic block diagram of an exemplary electronic device or apparatus 10, which may incorporate a codec according to an embodiment of the application.

The apparatus 10 may for example be a mobile terminal or user equipment of a wireless communication system. In other embodiments the apparatus 10 may be an audio-video device such as video camera, a Television (TV) receiver, audio recorder or audio player such as a mp3 recorder/player, a media recorder (also known as a mp4 recorder/player), or any computer suitable for the processing of audio signals.

The electronic device or apparatus 10 in some embodiments comprises a microphone 11, which is linked via an analogue-to-digital converter (ADC) 14 to a processor 21. The processor 21 is further linked via a digital-to-analogue (DAC) converter 32 to loudspeakers 33. The processor 21 is further linked to a transceiver (RX/TX) 13, to a user interface (UI) 15 and to a memory 22.

The processor 21 can in some embodiments be configured to execute various program codes. The implemented program codes in some embodiments comprise a multichannel or stereo encoding or decoding code as described herein. The implemented program codes 23 can in some embodiments be stored for example in the memory 22 for retrieval by the processor 21 whenever needed. The memory 22 could further provide a section 24 for storing data, for example data that has been encoded in accordance with the application.

The encoding and decoding code in embodiments can be implemented in hardware and/or firmware.

The user interface 15 enables a user to input commands to the electronic device 10, for example via a keypad, and/or to obtain information from the electronic device 10, for example via a display. In some embodiments a touch screen may provide both input and output functions for the user interface. The apparatus 10 in some embodiments comprises a transceiver 13 suitable for enabling communication with other apparatus, for example via a wireless communication network.

It is to be understood again that the structure of the apparatus 10 could be supplemented and varied in many ways.

A user of the apparatus 10 for example can use the microphone 11 for inputting speech or other audio signals that are to be transmitted to some other apparatus or that are to be stored in the data section 24 of the memory 22. A corresponding application in some embodiments can be activated to this end by the user via the user interface 15. This application in these embodiments can be performed by the processor 21, causes the processor 21 to execute the encoding code stored in the memory 22.

The analogue-to-digital converter (ADC) 14 in some embodiments converts the input analogue audio signal into a digital audio signal and provides the digital audio signal to the processor 21. In some embodiments the microphone 11 can comprise an integrated microphone and ADC function and provide digital audio signals directly to the processor for processing.

Figure 8:
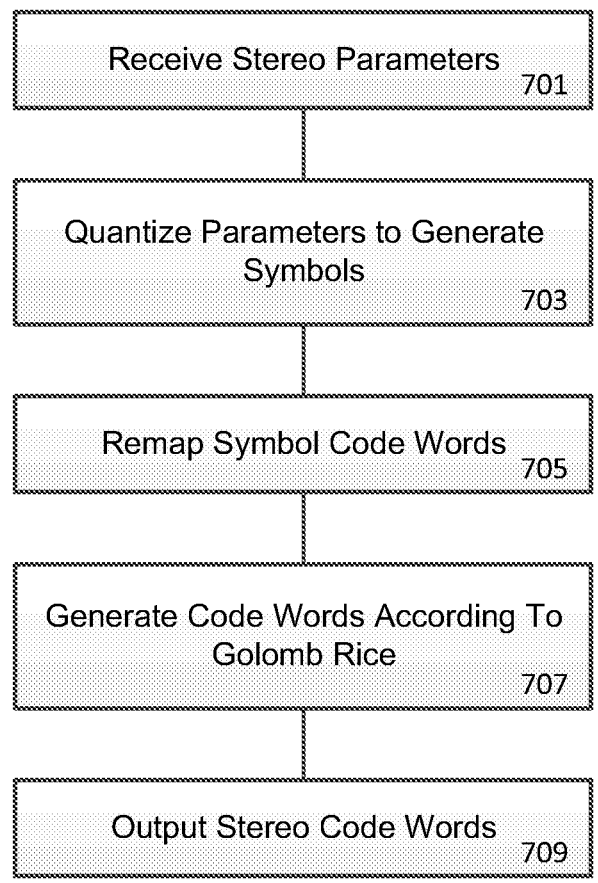
FIG. 8 shows a flow diagram illustrating the operation of the channel encoder as shown in FIG. 5 according to some embodiments.
Figure 9:
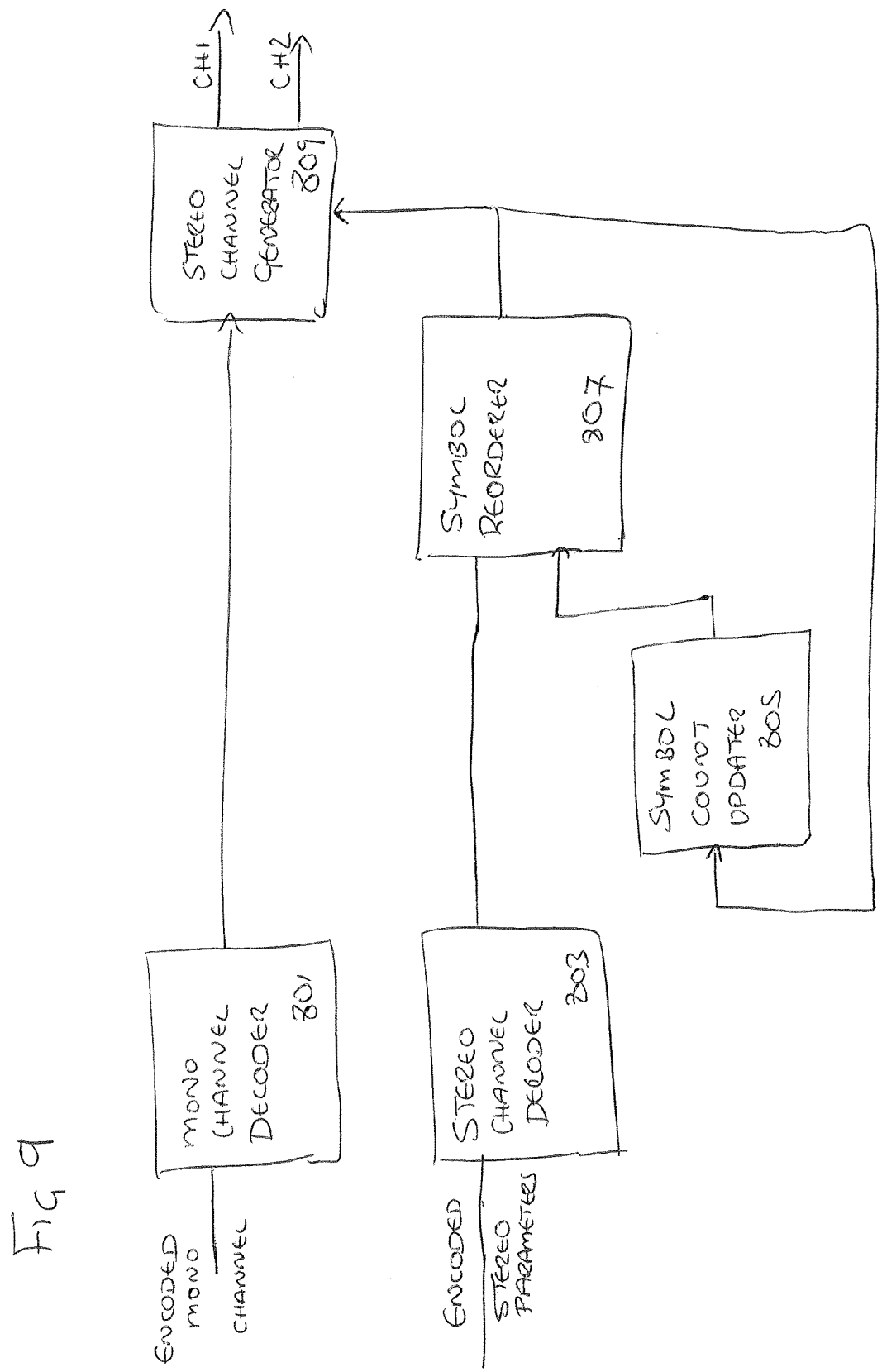
FIG. 9 shows schematically the decoder as shown in FIG. 2 according to some embodiments.
Figure 10:
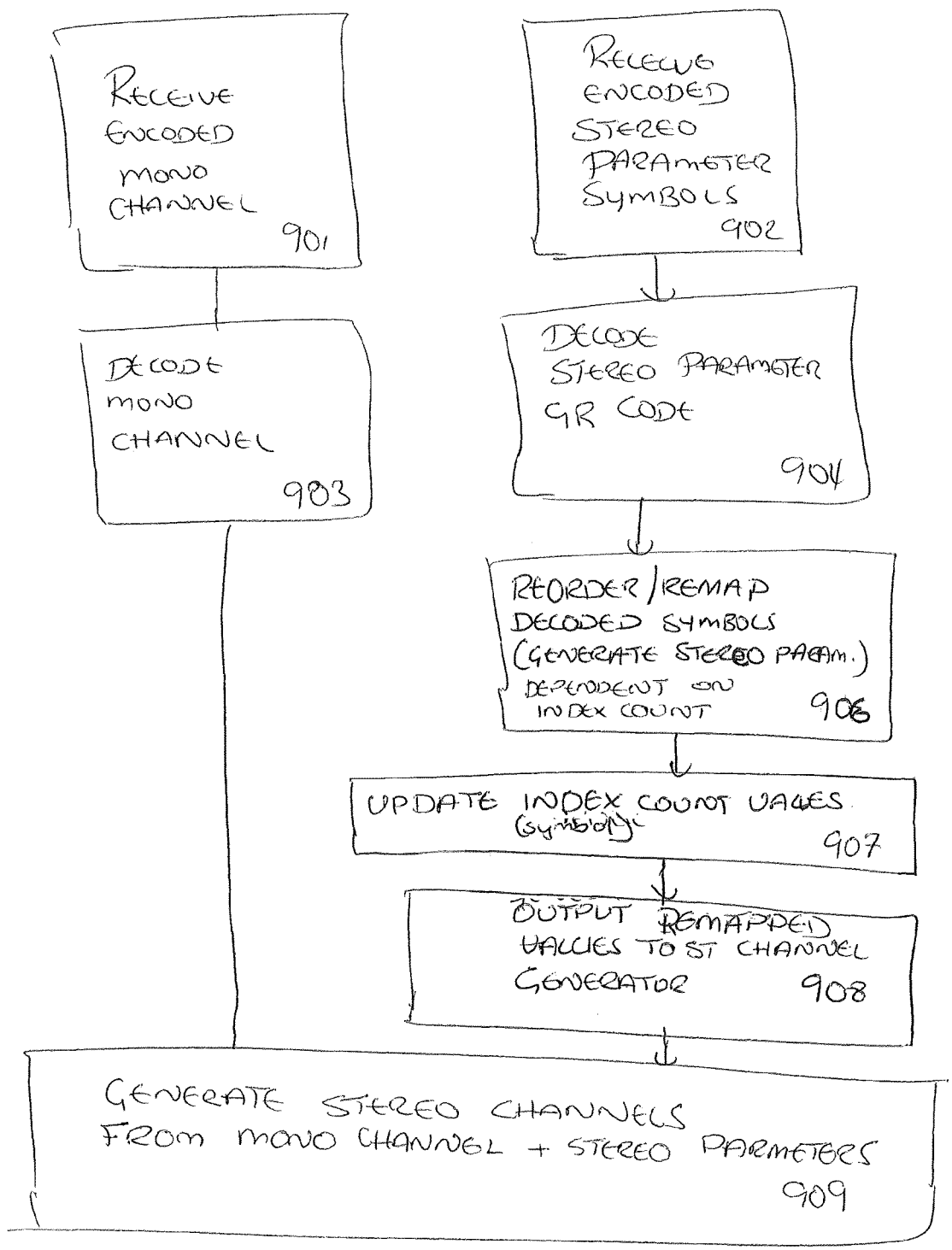
FIG. 10 shows a flow diagram illustrating the operation of the decoder as shown in FIG. 9 according to some embodiments.

The processor 21 in such embodiments then processes the digital audio signal in the same way as described with reference to the system shown in FIG. 2, the encoder shown in FIGS. 2 to 8 and the decoder as shown in FIGS. 9 and 10.

The resulting bit stream can in some embodiments be provided to the transceiver 13 for transmission to another apparatus. Alternatively, the coded audio data in some embodiments can be stored in the data section 24 of the memory 22, for instance for a later transmission or for a later presentation by the same apparatus 10.

The apparatus 10 in some embodiments can also receive a bit stream with correspondingly encoded data from another apparatus via the transceiver 13. In this example, the processor 21 may execute the decoding program code stored in the memory 22. The processor 21 in such embodiments decodes the received data, and provides the decoded data to a digital-to-analogue converter 32. The digital-to-analogue converter 32 converts the digital decoded data into analogue audio data and can in some embodiments output the analogue audio via the loudspeakers 33. Execution of the decoding program code in some embodiments can be triggered as well by an application called by the user via the user interface 15.

The received encoded data in some embodiment can also be stored instead of an immediate presentation via the loudspeakers 33 in the data section 24 of the memory 22, for instance for later decoding and presentation or decoding and forwarding to still another apparatus.

It would be appreciated that the schematic structures described in FIGS. 3 to 5 and 9, and the method steps shown in FIGS. 6 to 8 and 10 represent only a part of the operation of an audio codec and specifically part of a stereo encoder/decoder apparatus or method as exemplarily shown implemented in the apparatus shown in FIG. 1.

Figure 2:
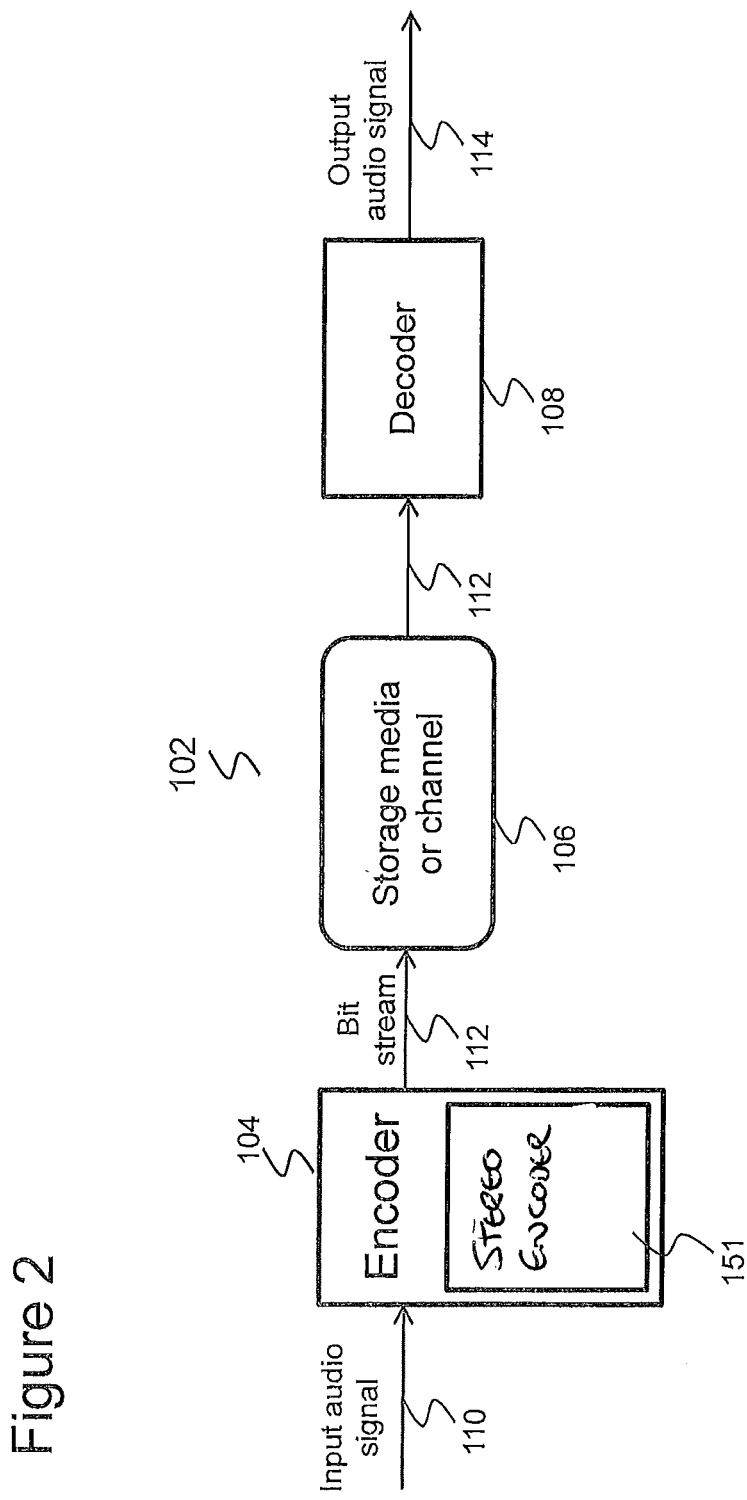
FIG. 2 shows schematically an audio codec system according to some embodiments.

The general operation of audio codecs as employed by embodiments is shown in FIG. 2. General audio coding/decoding systems comprise both an encoder and a decoder, as illustrated schematically in FIG. 2. However, it would be understood that some embodiments can implement one of either the encoder or decoder, or both the encoder and decoder. Illustrated by FIG. 2 is a system 102 with an encoder 104 and in particular a stereo encoder 151, a storage or media channel 106 and a decoder 108. It would be understood that as described above some embodiments can comprise or implement one of the encoder 104 or decoder 108 or both the encoder 104 and decoder 108.

The encoder 104 compresses an input audio signal 110 producing a bit stream 112, which in some embodiments can be stored or transmitted through a media channel 106. The encoder 104 furthermore can comprise a stereo encoder 151 as part of the overall encoding operation. It is to be understood that the stereo encoder may be part of the overall encoder 104 or a separate encoding module. The encoder 104 can also comprise a multi-channel encoder that encodes more than two audio signals.

The bit stream 112 can be received within the decoder 108. The decoder 108 decompresses the bit stream 112 and produces an output audio signal 114. The decoder 108 can comprise a stereo decoder as part of the overall decoding operation. It is to be understood that the stereo decoder may be part of the overall decoder 108 or a separate decoding module. The decoder 108 can also comprise a multi-channel decoder that decodes more than two audio signals. The bit rate of the bit stream 112 and the quality of the output audio signal 114 in relation to the input signal 110 are the main features which define the performance of the coding system 102.

Figure 3:
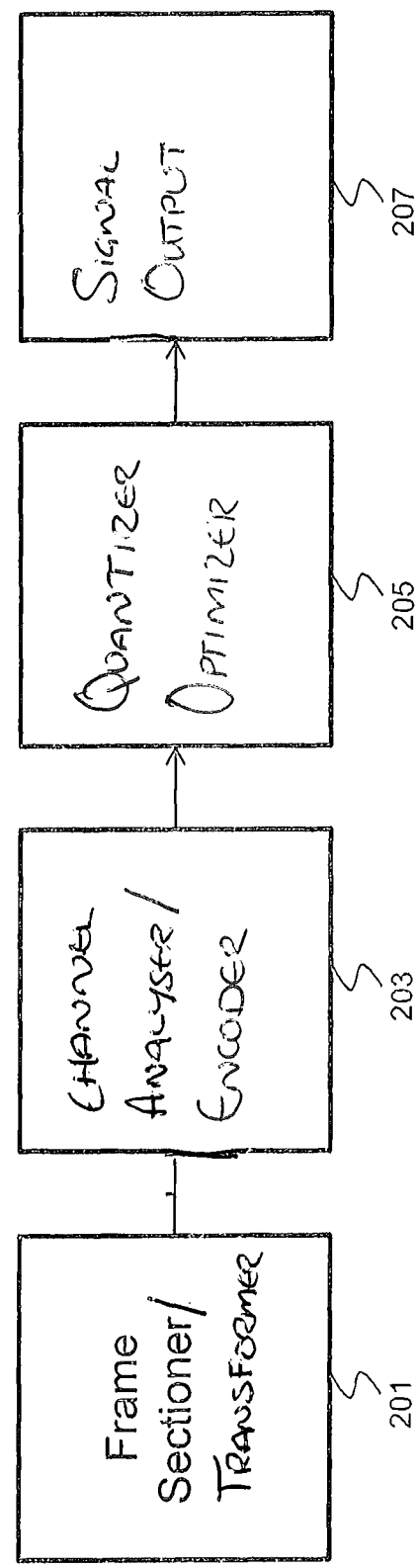
FIG. 3 shows schematically an encoder as shown in FIG. 2 according to some embodiments.

FIG. 3 shows schematically the encoder 104 according to some embodiments.

Figure 6:
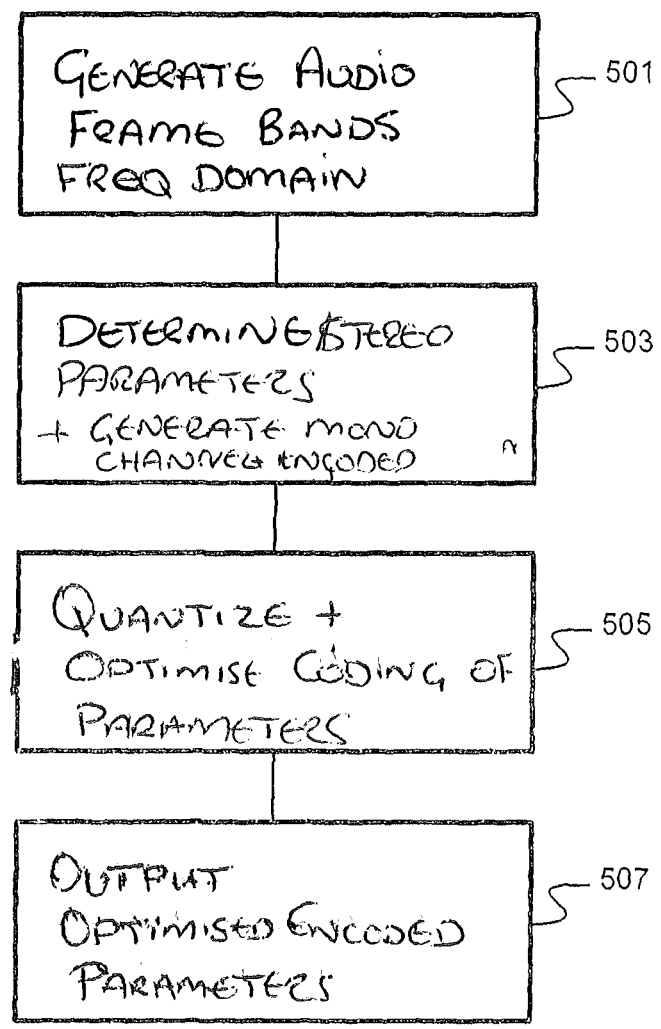
FIG. 6 shows a flow diagram illustrating the operation of the encoder shown in FIG. 2 according to some embodiments.

FIG. 6 shows schematically in a flow diagram the operation of the encoder 104 according to some embodiments.

The concept for the embodiments as described herein is to attempt to form a stereo or multichannel coding to produce efficient high quality and low bit rate stereo or multichannel signal coding. The use of Golomb-Rice coding within an integer encoder is able to produce a very low complexity encoder suitable for providing good compression efficiency where data is exponentially distributed. Golomb-Rice codes or entropy encoding for example can be used where the number of coding symbols is not known or fixed. Furthermore Golomb-Rice or entropy encoding of integers can be performed on the quantisation codevector indices to reduce the bit rate.

It would be understood that encoding indices of quantised sub-band level differences in binaural representations of stereo audio signals produce values where the probability distribution changes dramatically one frame to another.

An entropy encoder configured to encode average values of the data would therefore produce sub-optimal results. Although an adaptive Golomb-Rice coding parameter could have greater efficiency they produce poor results in the circumstances where the probability densities of the data change between frames.

Thus in the embodiments a low complexity adaptive entropy coding is described herein using a Golomb-Rice coding scheme to produce a low bit rate and low complexity encoder. In such embodiments the encoding can be improved after encoding each symbol by adaptively changing the order of the symbols to be coded with a Golomb-Rice encoder and consequently the codewords assigned to them. The coding method as described herein is applicable to a wide range of data and in the embodiments described herein it occurs within binaural coding extensions of an audio codec for example the coding of the channel level differences.

The concept for the embodiments as described herein is to determine and apply a stereo coding mode to produce efficient high quality and low bit rate real life stereo signal coding. To that respect with respect to FIG. 3 an example encoder 104 is shown according to some embodiments. Furthermore with respect to FIG. 6 the operation of the encoder 104 is shown in further detail.

The encoder 104 in some embodiments comprises a frame sectioner/transformer 201. The frame sectioner/transformer 201 is configured to receive the left and right (or more generally any multichannel audio representation) input audio signals and generate frequency domain representations of these audio signals to be analysed and encoded. These frequency domain representations can be passed to the channel parameter determiner 203.

In some embodiments the frame sectioner/transformer can be configured to section or segment the audio signal data into sections or frames suitable for frequency domain transformation. The frame sectioner/transformer 201 in some embodiments can further be configured to window these frames or sections of audio signal data according to any suitable windowing function. For example the frame sectioner/transformer 201 can be configured to generate frames of 20 ms which overlap preceding and succeeding frames by 10 ms each.

In some embodiments the frame sectioner/transformer can be configured to perform any suitable time to frequency domain transformation on the audio signal data. For example the time to frequency domain transformation can be a discrete Fourier transform (DFT), Fast Fourier transform (FFT), modified discrete cosine transform (MDCT). In the following examples a Fast Fourier Transform (FFT) is used. Furthermore the output of the time to frequency domain transformer can be further processed to generate separate frequency band domain representations (sub-band representations) of each input channel audio signal data. These bands can be arranged in any suitable manner. For example these bands can be linearly spaced, or be perceptual or psychoacoustically allocated.

The operation of generating audio frame band frequency domain representations is shown in FIG. 6 by step 501.

In some embodiments the frequency domain representations are passed to a channel analyser/encoder 203.

In some embodiments the encoder 104 can comprise a channel analyser/encoder 203. The channel analyser/encoder 203 can be configured to receive the sub-band filtered representations of the multichannel or stereo input. The channel analyser/encoder 203 can furthermore in some embodiments be configured to analyse the frequency domain audio signals and determine parameters associated with each sub-band with respect to the stereo or multichannel audio signal differences. Furthermore the channel analyser/encoder can use these parameters and generate a mono channel which can be encoded according to any suitable encoding.

The stereo parameters and the monitor encoded signal can the output to the quantizer optimiser 205.

The operation of determining the stereo parameters and generating the mono channel and encoding the mono channel is shown in FIG. 6 by step 503.

Figure 4:
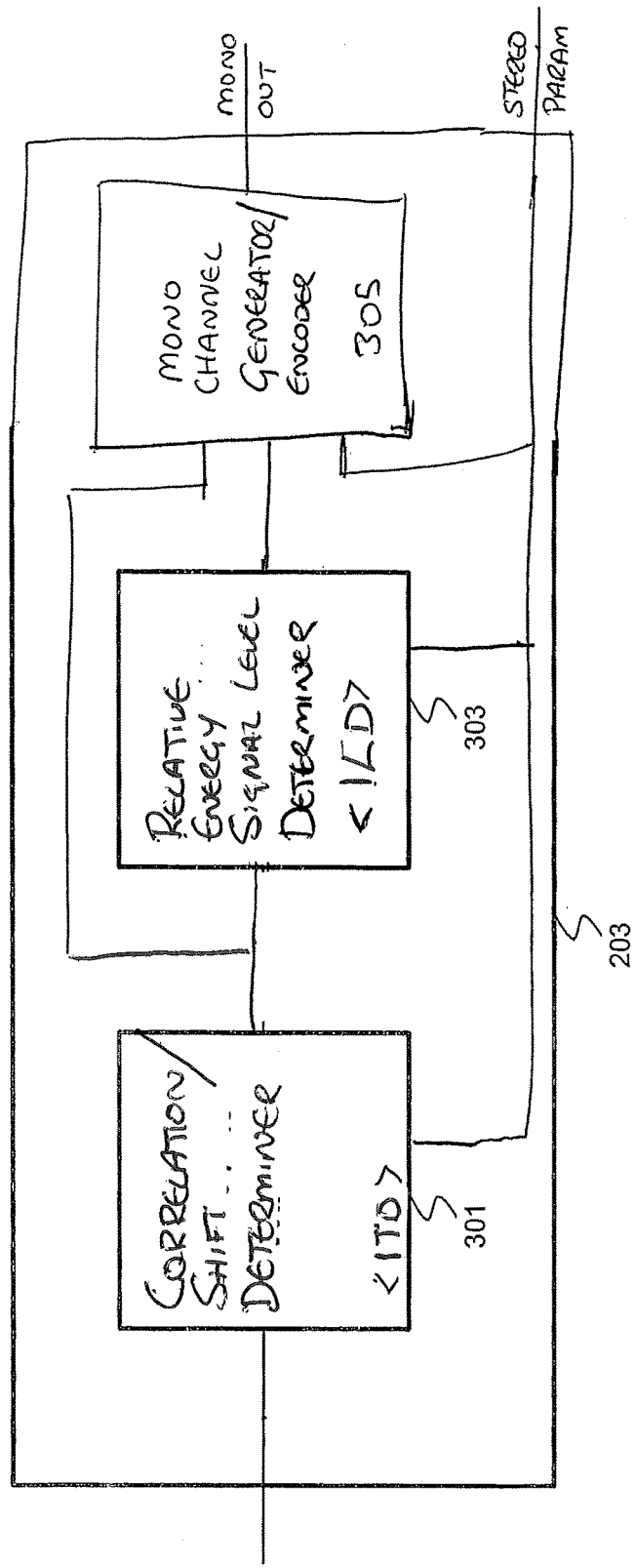
FIG. 4 shows schematically a channel analyser as shown in FIG. 3 in further detail according to some embodiments.

With respect to FIG. 4 an example channel analyser/encoder 203 according to some embodiments is described in further detail. Furthermore with respect to FIG. 7 the operation of the channel analyser/encoder 203 as shown in FIG. 4 is shown according to some embodiments.

In some embodiments the channel analyser 203 comprises a correlation/shift determiner 301. The correlation/shift determiner 301 is configured to determine the correlation or shift per sub-band between the two channels (or parts of multi-channel audio signals). The shifts (or the best correlation indices COR_IND[j]) can be determined for example using the following code.

```
for ( j = 0; NUM_OF_BANDS_FOR_COR_SEARCH; j++ )
{
  cor = COR_INIT;
  for ( n = 0; n < 2*MAXSHIFT + 1; n++ )
  {
    mag[n] = 0.0f;
    for ( k = COR_BAND_START[j];
    k < COR_BAND_START[j+1]; k++ )
    {
      mag[n] += svec_re[k] * cos( -2*PI*((n-MAXSHIFT) *
      k / L_FFT );
```

```
      mag[n] -= svec_im[k] * sin( -2*PI*((n-MAXSHIFT) *
      k / L_FFT );
    }
    if (mag[n] > cor)
    {
      cor_ind[j] = n - MAXSHIFT;
      cor = mag[n];
    }
  }
}
```

Where the value MAXSHIFT is the largest allowed shift (the value can be based on a model of the supported microphone arrangements or more simply the distance between the microphones) PI is $\pi$, COR_INIT is the initial correlation value or a large negative value to initialise the correlation calculation, and COR_BAND_START [ ] defines the starting points of the sub-bands. The vectors svec_re [ ] and svec_im [ ], the real and imaginary values for the vector, used herein are defined as follows:

```
svec_re[0] = fft_l[0] *fft_r[0];
svec_im[0] = 0.0f;
for (k = 1; k < COR_BAND_START[NUM_OF_BANDS_FOR_COR_SEARCH];
k++)
{
  svec_re[k] = (fft_l[k] * fft_r[k])-(fft_l[L_FFT-k] *
  (-fft_r[L_FFT-k]));
  svec_im[k] = (fft_l[L_FFT-k] * fft_r[k]) + (fft_l[k] *
  (-fft_r[L_FFT-k]));
}
```

Figure 7:
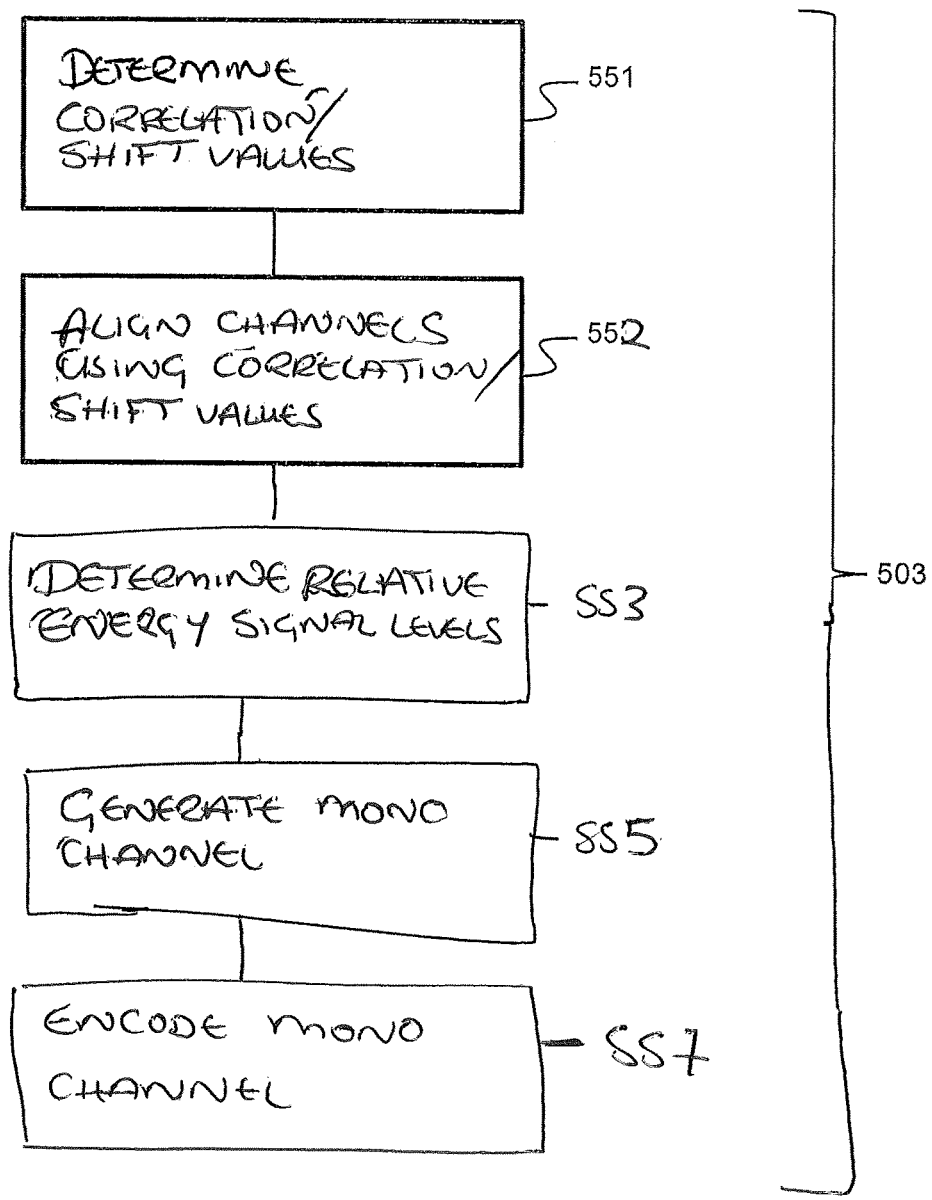
FIG. 7 shows a flow diagram illustrating the operation of the channel analyser as shown in FIG. 4 according to some embodiments.

The operation of determining the correlation/shift values is shown in FIG. 7 by step 551.

The correlation/shift values can in some embodiments be passed to the mono channel generator/encoder and as stereo channel parameters to the quantizer optimiser.

Furthermore in some embodiments the correlation/shift value is applied to one of the audio channels to provide a temporal alignment between the channels. These aligned channel audio signals can in some embodiments be passed to a relative energy signal level determiner 301.

The operation of aligning the channels using the correlation/shift value is shown in FIG. 7 by step 552.

In some embodiments the channel analyser/encoder 203 comprises a relative energy signal level determiner 301. The relative energy signal level determiner 301 is configured to receive the output aligned frequency domain representations and determine the relative signal levels between pairs of channels for each sub-band. It would be understood that in the following examples a single pair of channels are analysed and processed however this can be extended to any number of channels by a suitable pairing of the multichannel system.

In some embodiments the relative level for each band can be computing using the following code.

```
For (j = 0; j < NUM_OF_BANDS_FOR_SIGNAL_LEVELS; j++)
{
  mag_l = 0.0;
  mag_r = 0.0;
  for (k = BAND_START[j]; k < BAND_START[j+1]; k++)
  {
    mag_l += fft_l[k]*fft_l[k] + fft_l[L_FFT-k]*fft_l[L_FFT-k];
    mag_r += fft_r[k]*fft_r[k] + fft_r[L_FFT-k]*fft_r[L_FFT-k];
  }
  mag[j] = 10.0f*log10(sqrt((mag_l+EPSILON)/(mag_r+EPSILON)));
}
```

Where L_FFT is the length of the FFT and EPSILON is a small value above zero to prevent division by zero problems. The relative energy signal level determiner in such embodiments effectively generates magnitude determinations for each channel (L and R) over each sub-band and then divides one channel value by the other to generate a relative value. In some embodiments the relative energy signal level determiner 301 is configured to output the relative energy signal level to the encoding mode determiner 205.

The operation of determining the relative energy signal level is shown in FIG. 7 by step 551.

The relative energy signal level values can in some embodiments be passed to the mono channel generator/encoder and as stereo channel parameters to the quantizer optimiser.

In some embodiments any suitable inter level (energy) and inter temporal (correlation or delay) difference estimation can be performed. For example for each frame there can be two windows for which the delay and levels are estimated. Furthermore in some embodiments for each window the delays can estimated for each of the delay relevant sub bands.

In some embodiments the encoder 104 comprises a mono channel generator/encoder 305. The mono channel generator is configured to receive the channel analyser values such as the relative energy signal level from the relative energy signal level determiner 301 and the correlation/shift level from the correlation/shift determiner 303. Furthermore in some embodiments the mono channel generator/encoder 305 can be configured to further receive the input multichannel audio signals. The mono channel generator/encoder 305 can in some embodiments be configured to apply the delay and level differences to the multichannel audio signals to generate an 'aligned' channel which is representative of the audio signals. In other words the mono channel generator/encoder 305 can generate a mono channel signal which represents an aligned multichannel audio signal. For example in some embodiments where there is determined to be a left channel audio signal and a right channel audio signal one of the left or right channel audio signals are delayed with respect to the other according to the determined delay difference and then the delayed channel and other channel audio signals are averaged to generate a mono channel signal. However it would be understood that in some embodiments any suitable mono channel generating method can be implemented.

The operation of generating a mono channel signal from a multichannel signal is shown in FIG. 7 by step 555.

The mono channel generator/encoder 305 can then in some embodiments encode the generated mono channel audio signal using any suitable encoding format. For example in some embodiments the mono channel audio signal can be encoded using an Enhanced Voice Service (EVS) mono channel encoded form, which may contain a bit stream interoperable version of the Adaptive Multi-Rate-Wide Band (AMR-WB) codec.

The operation of encoding the mono channel is shown in FIG. 7 by step 557.

The encoded mono channel signal can then be output. In some embodiments the encoded mono channel signal is output to a multiplexer to be combined with the output of the quantizer optimiser 205 to form a single stream or output. In some embodiments the encoded mono channel signal is output separately from the quantizer optimiser 205.

In some embodiments the encoder 104 comprises a quantizer optimiser 205. The quantizer optimiser 205 can be configured to receive the stereo (difference) parameters determined by the channel analyser 203. The quantizer optimiser 205 can then in some embodiments be configured to perform a quantization on the parameters and furthermore encode the parameters so that they can be output (either to be stored on the apparatus or passed to a further apparatus).

The operation of quantizing and encoding the quantized stereo parameters is shown in FIG. 6 by step 505.

Figure 5:
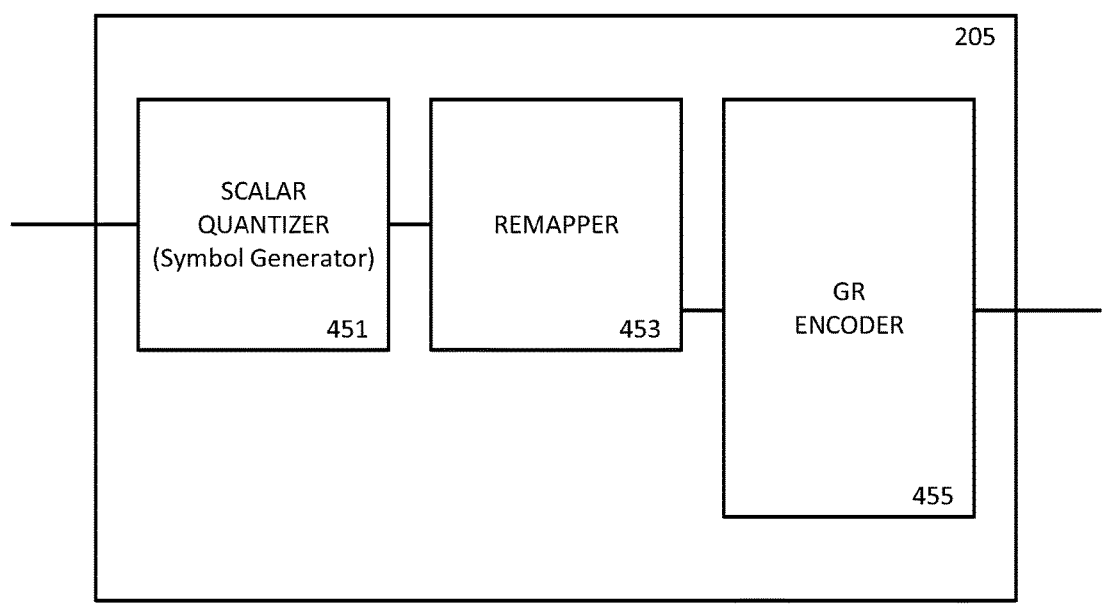
FIG. 5 shows schematically a stereo channel encoder as shown in FIG. 3 in further detail according to some embodiments.

With respect to FIG. 5 an example quantizer optimiser 205 is shown in further detail. Furthermore with respect to FIG. 8 the operation of the quantizer optimiser 205 according to some embodiments is shown.

In some embodiments the quantizer optimiser 205 comprises a scalar quantizer 451. The scalar quantizer 451 is configured to receive the stereo parameters from the channel analyser 203

The operation of receiving the stereo parameters is shown in FIG. 8 by step 701.

The scalar quantizer can be configured to perform a scalar quantization on these values. For example the scalar quantizer 451 can be configured to quantize the values with quantisation partition regions defined by the following array.

Q={−10000.0, −8.0, −5.0, −3.0, −1.0, 1.0, 3.0, 5.0, 8.0, 100000.0}

The scalar quantizer 451 can thus output an index value symbol associated with the region within the quantization partition region the level difference value occurs within. For example an initial quantisation index value output can be as follows:

| Input difference range | −100000.0 −8.0 | −8.0 −5.0 | −5.0 −3.0 | −3.0 −1.0 | −1.0 1.0 | 1.0 3.0 | 3.0 5.0 | 5.0 8.0 | 8.0 100000 |
|---|---|---|---|---|---|---|---|---|---|
| Output index | 0 | 1 | 2 | 3 | 4 | 5 | 6 | 7 | 8 |
| Mapped to | 8 | 6 | 4 | 2 | 0 | 1 | 3 | 5 | 7 |

The index values can in some embodiments be output to a remapper 451.

The operation of quantizing the difference or stereo parameters to generate index values or symbols is shown in FIG. 8 by step 703.

In some embodiments the quantizer optimiser 205 comprises a remapper 453. The remapper 453 can in some embodiments be configured to receive the output of the scalar quantizer 451, in other words an index value associated with the quantization partition region within which the stereo or difference parameter is found and then the map the index values for each frame according to the occurrence frequency of the index values.

In some embodiments the remapper can perform an initial map, an example of which is shown in the table above where the output index map {0,1,2,3,4,5,6,7,8} is initially mapped to {8,6,4,2,0,1,3,5,7}. This initial map is in some embodiments useful when the lower values (in absolute value sense) are more probable. In the following embodiments the initial mapping is applied prior to entering the adapt_GR function shown hereafter, where it is further altered by the reordering based on count values. In some embodiments the adapt_GR function can apply the initial mapping to replace the trivial initial 1:1 mapping shown in the function. The initial map can in some embodiments be selected based on the encoding method to be used later following the reordering or remapping and can be understood as an initial mapping to assist the remapping.

The remapper 453 can for example for each frame analyse each sub-band quantized difference value and perform a reordering of the index values after each analysis.

For example the remapper 453 can be represented by the following C code.

```
short               /* (o) number of bits */
adapt_GR(   short * in,    /* (i) integer sequence to be encoded */
            short len,     /* (i) sequence length */
            short m,       /* (i) Golomb Rice parameter to be used
    at encoding */
            short no_symb, /* (i) maximum number of symbols */
            short max_bits,/* (i) maximum number of bits */
            short * qlen)  /* (o) index up to which the lower
    frequencies levels are      not encoded */
{
    short map[NO_SYMB_LEVEL], idx[NO_SYMB_LEVEL];
    short nbits, i, j, symb, map_symb, tmp_int;
    float count[NO_SYMB_LEVEL], tmp;
    set_f(count,1,no_symb);
    /* init map */
    for(i=0;i<no_symb;i++)
    {
        map[i] = i;
        idx[i] = i;
    }
    nbits = 0;
        /* the symbols are read from the end, because the most
        relevant level values are for higher frequencies; if there
        are not enough bits, the levels corresponding to lower
        frequencies will be ignored*/
    for(i=len-1;i>0;i--)
    {
        symb = in[i];
        /* map keeps the order of the symbols */
        map_symb = map[symb];
            /* count number of bits to GR encode with
            parameter m, encoding is done in mapped domain
            */
        nbits += ((map_symb)>>m) + m + 1;
        if (nbits<max_bits)
        {
            /* weight down the influence of the past */
            for(j=0;j<no_symb;j++)
            {
                count[j] *= 0.9f;
            }
                /* update count of symbols */
            count[map_symb] = count[map_symb]+1;
            j = map_symb;
            /* here the adaptation of the symbol order is done*/
            /* sort decreasing */
            while ((j>0) && (count[j]>count[j-1]))
            {
                /* bubble j and j-1 */
                tmp = count[j];
                count[j] = count[j-1];
                count[j-1] = tmp;
                tmp_int = idx[j] ;
                idx[j] = idx[j-1];
                idx[j-1] = tmp_int;
                j--;
            }
            /* map update based on the new order */
            for(j=0;j<no_symb;j++)
            {
                map[idx[j]] = j;
            }
        }
        else
        {
            /* not enough bits */
            nbits -= ((map_symb)>>m) + m + 1;
            break;
        }
    }
    *qlen = i;
    return nbits;
}
```

The section labelled *init map* (or initial mapping) following the variable definition section generates an initial mapping where the symbols or quantizer index outputs i=0 to i=no_symb−1 (in other words the number of different quantizer index values, which for the example shown above is 9 {0,1, . . . 7,8}).

The section following the initial mapping, the remapping section, shows that the index values or symbols are read from the higher frequency sub-bands to the lower frequency sub-bands and are remapped according to the count value of the symbol within the frame. The count value is determined within the example shown herein by maintaining a running count of the symbol or index values, where the influence of the 'past' symbols is weighted downwards by a 0.9 recurrence factor.

The recurrence factor, the count increment factor, and the remapping or reordering can vary according to some embodiments. For example the recurrence factor in some embodiments can be a value less than 0.9 to give less weighting to past index or symbol values. For example, in other embodiments, the recurrence factor can have different values for different past encoded symbols, i.e. 0.9 for the previously encoded symbol and 0.8 for the second previous symbol encoded and so on. For example in some embodiments reordering can be made where symbols with same Count value are given. Furthermore in some embodiments in the situation or case of equal Count values, the lower valued symbols are ordered or mapped to get the position with smaller code length, or vice versa where it is known from the context that the probability of high valued symbols is higher.

The output of the remapper 453, which orders the index values or symbols according to their occurrence within the frame across the sub bands or windows is then output to the encoder.

In the examples described herein the encoder performs remapping as encoding occurs. In some embodiments each frame is analysed and the frequency or distribution of the symbols once the whole frame is analysed is used to determine the remapping of symbols.

The operation of remapping the index values or symbols according to frequency is shown in FIG. 8 by step 705.

The quantizer optimiser 205 can in some embodiments comprises a Golomb-Rice encoder 455. The Golomb-Rice encoder (GR encoder) 455 is configured to receive the remapped index values or symbols generated by the remapper and encode the index values according to the Golomb-rice encoding method. The Golomb-Rice encoder 455 in such embodiments therefore outputs a codeword representing the current and previous index values.

An example of a Golomb-Rice integer code (with GR parameter equal to 0) is one where the output is as follows.

| Input | | | | | | | | | |
|---|---|---|---|---|---|---|---|---|---|
| | 0 | 1 | 2 | 3 | 4 | 5 | 6 | 7 | 8 |
| Output | 0 | 10 | 110 | 1110 | 11110 | 111110 | 1111110 | 11111110 | 111111110 |

It would be understood that any suitable entropy encoding can be used in place of the GR integer code described herein.

The operation of generating codewords according to the Golomb-Rice coding system is shown in FIG. 8 by step 707.

The GR encoder 455 can then output the stereo codewords. In some embodiments the codewords are passed to a multiplexer to be mixed with the encoded mono channel audio signal. However in some embodiments the stereo codewords can in some embodiments be passed to be stored or passed to further apparatus as a separate stream.

The operation of outputting stereo codewords is shown in FIG. 8 by step 709.

In some embodiments the encoder comprises a signal output 207. The signal output as shown in FIG. 3 represents an output configured to pass the encoded stereo parameters to be stored or transmitted to a further apparatus.

The outputting of the encoded stereo parameters is shown in FIG. 6 by step 507.

Thus in summary the embodiments described with respect to the quantizer optimiser is as follow Receive difference values Quantize difference values to generate symbols representing quantization map region (in other words generate array of symbols to encode, x, $x[i] \in [0, N-1]$, i=1:M)

Generate initial mapping from symbols (index values) for example assume one original order of the symbols such that the first symbol will be given the GR code for 0, the second one the GR code for 1 and so on Generate initial count Count[j]=1, j=0:N−1 (initial array of counts for each symbol)

- For each symbol (For i=0:length(x)−1)
    - Encode x[i]
    - Update Count with :
        i. Count[j] = 0.9*Count[j], j=0:N−1, (weighting of the past)
        ii. Count[x[i]] = Count[x[i]] + 1;
    - Reorder the symbols based on the frequency of occurrence, such that the most frequent is on the first position (will be encoded with GR code for 0)
  End for Furthermore the embodiments described herein can be demonstrated with respect to a simple example Where N is 5 an original order or mapping can be
Order=[0 1 2 3 4] (N=5).

Furthermore the count associated with the mapping can be
Count=[1 1 1 1 1].

The index input array (the quantized difference values) can be
x=[2 2 0 0 . . . ]

Then the first encoding is (if GR parameter 0 is considered)

Encode x[0]=2, with '110' (as 2 is $2^{nd}$ position in Order).
The count value can then be updated which generates
Count=[0.9 0.9 1.9 0.1 0.9].
The order can then be updated
Order=[2 0 1 3 4].
This completes the first of the 'for' loops.
The next symbol (index value) is analysed and encoded
Encode x[1]=2, with '0' (as 2 is $0^{th}$ position in Order).
The count value can then be updated which generates
Count=[2.71 0.81 0.81 0.81 0.81].
The order can then be updated but without change
Order=[2 0 1 3 4].

this can then continue until in some embodiments all of the symbols are coded (full stereo coding) or in some embodiments until the number of bits available are met (bandwidth limited coding).

In order to fully show the operations of the codec FIGS. 9 and 10 show a decoder and the operation of the decoder according to some embodiments.

In some embodiments the decoder 108 comprises a mono channel decoder 801. The mono channel decoder 801 is configured in some embodiments to receive the encoded mono channel signal.

The operation of receiving the encoded mono channel audio signal is shown in FIG. 10 by step 901.

Furthermore the mono channel decoder 801 can be configured to decode the encoded mono channel audio signal using the inverse process to the mono channel coder shown in the encoder.

The operation of decoding the mono channel is shown in FIG. 10 by step 903.

In some embodiments the mono channel decoder 801 can be configured to output the mono channel audio signal to the stereo channel generator 809.

In some embodiments the decoder 108 can comprise a stereo channel decoder 803. The stereo channel decoder 803 is configured to receive the encoded stereo parameters.

The operation of receiving the encoded stereo parameters is shown in FIG. 10 by step 902.

Furthermore the stereo channel decoder 803 can be configured to decode the stereo channel signal parameters from the entropy code. For example the reverse of the example code can be used as shown herein so that

| Output | | | | | | | | | |
|---|---|---|---|---|---|---|---|---|---|
| | 0 | 1 | 2 | 3 | 4 | 5 | 6 | 7 | 8 |
| Input | 0 | 10 | 110 | 1110 | 11110 | 111110 | 1111110 | 11111110 | 111111110 |

The operation of decoding the stereo parameters is shown in FIG. 10 by step 904.

The stereo channel decoder 803 is further configured to output the decoded index values to a symbol reorderer 807.

In some embodiments the decoder comprises a symbol count updater 805. The symbol count updater 805 can be configured to receive the current frame stereo channel index values (decoded and reordered symbols) and maintain a count of the reordered (remapped) values using the same count process as used in the encoder. In other words the symbol count updater 805 is configured to update a counter based on the symbols currently decoded within a frame. The symbol count updater 805 is configured to reset the count for each count so that the reordering/remapping is done for each frame.

The (symbol) index count or frequency order can be output to the symbol reorderer 807.

In some embodiments the decoder 108 comprises a symbol reorderer 807. The symbol or index reorderer (demapper) in some embodiments is configured to receive the symbol count updater output (in other words the index/symbol count frequency) and reorder the decoded symbols received from the stereo channel decoder 803 according to the symbol frequency. In other words the symbol reorderer 807 is configured to re-order the index values to the original order output by the scaler quantizer. Furthermore in some embodiments the symbol reorderer 807 is configured to de-quantize the remapped or re-ordered index value into a parameter (such as the interaural time difference/correlation value; and interaural level difference/energy difference value) using the inverse process to that defined within the quantizer section of the quantizer optimiser within the encoder.

The operation of re-ordering and dequantizing the decoded symbols to generate dequantized (regenerated) stereo parameters for each frame is shown in FIG. 10 by step 906

The symbol count updater 805 can receive the re-ordered symbol and update the count. The symbol count data can be output to the symbol reorderer 807 for the next symbol re-ordering.

The updating of the symbol (index) count within the frame is shown in FIG. 10 by step 907.

The symbol reorderer 807 can furthermore output the reordered index value to the stereo channel generator.

The outputting of the stereo parameters to the stereo channel generator is shown in FIG. 10 by step 908.

In some embodiments the decoder comprises a stereo channel generator 809 configured to receive the reordered decoded symbols (the stereo parameters) and the decoded mono channel and regenerate the stereo channels in other words applying the level differences to the mono channel to generate a second channel.

The operation of generating the stereo channels from the mono channel stereo parameters is shown in FIG. 10 by step 909.

Figure 11:
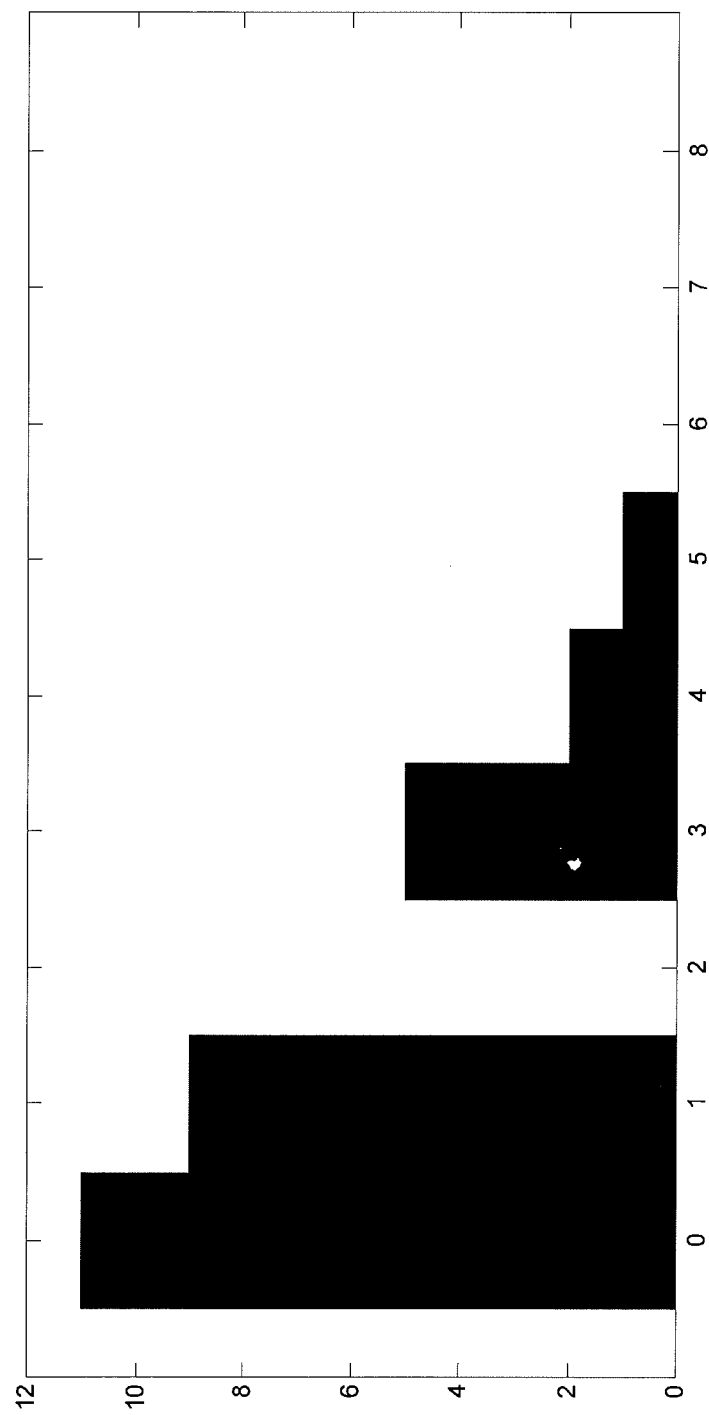
FIGS. 11 and 12 show example frequency distribution histograms when using embodiments as described herein.
Figure 12:
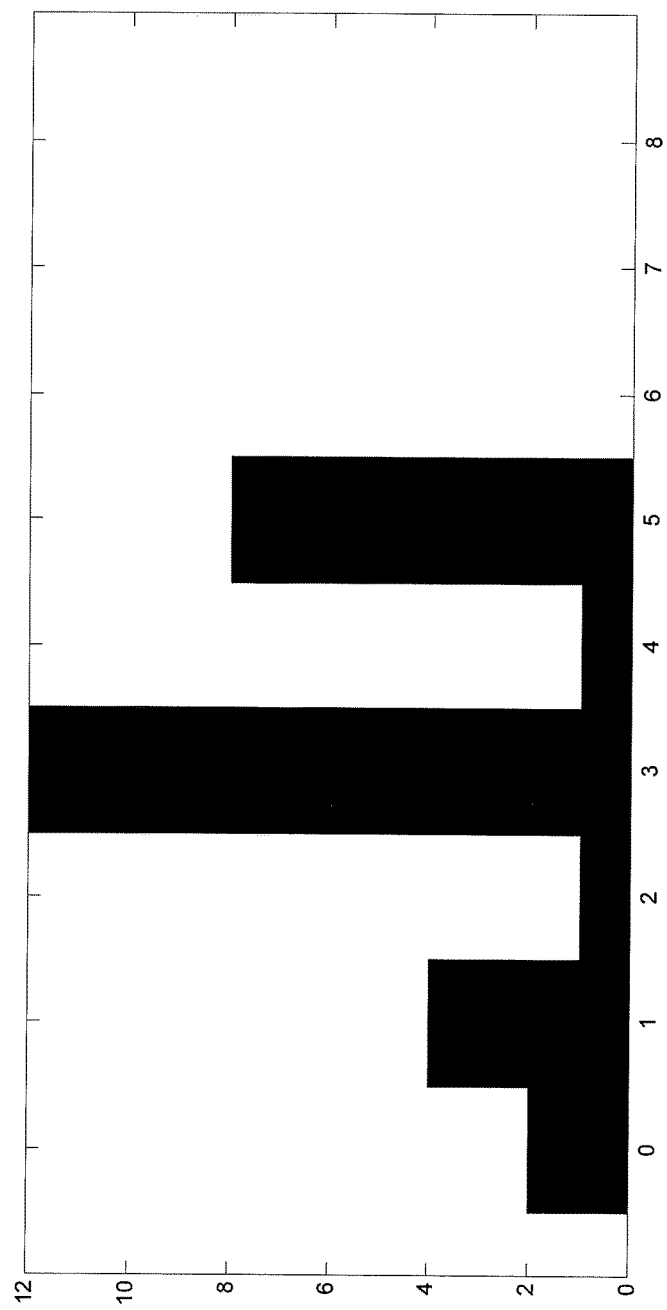

With respect to FIGS. 11 and 12 a set of example histogramic representations of the symbol (index values) representing a frame are shown.

Figure 13:
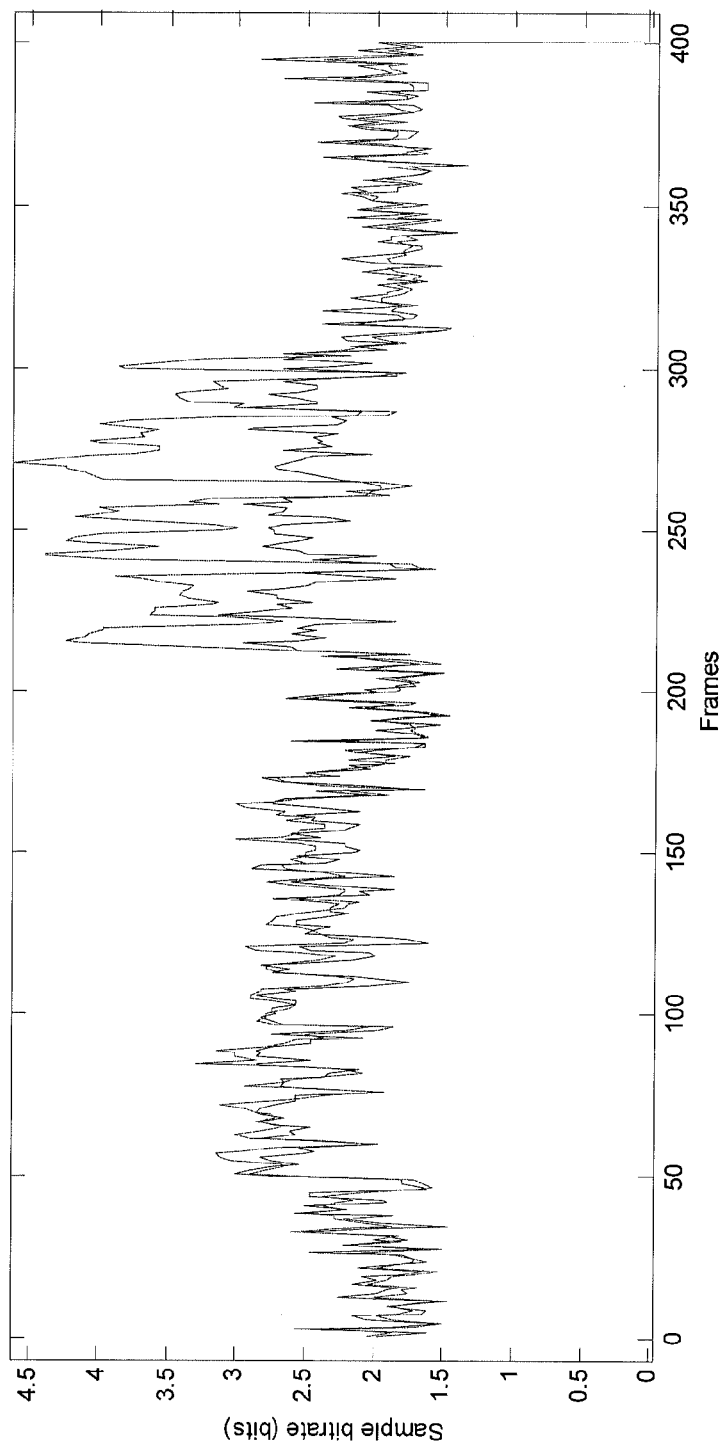
FIG. 13 shows encoding symbol averages with respect to some embodiments as described herein.

Furthermore with respect to FIG. 13 an example of the sample bitrate of a conventional GR coding with selection between parameter 0 and 1 and GR coding using embodiments as described herein show that the proposed bit rate values are lower in the example reflecting embodiments as described herein.

Although the above examples describe embodiments of the application operating within a codec within an apparatus 10, it would be appreciated that the invention as described below may be implemented as part of any audio (or speech) codec, including any variable rate/adaptive rate audio (or speech) codec. Thus, for example, embodiments of the application may be implemented in an audio codec which may implement audio coding over fixed or wired communication paths.

Thus user equipment may comprise an audio codec such as those described in embodiments of the application above.

It shall be appreciated that the term user equipment is intended to cover any suitable type of wireless user equipment, such as mobile telephones, portable data processing devices or portable web browsers.

Furthermore elements of a public land mobile network (PLMN) may also comprise audio codecs as described above.

In general, the various embodiments of the application may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the application may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments of this application may be implemented by computer software executable by a data processor of the mobile device, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

Embodiments of the application may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules.

Once the design for a semiconductor circuit has been completed, the resultant design, in a standardized electronic format (e.g., Opus, GDSII, or the like) may be transmitted to a semiconductor fabrication facility or "fab" for fabrication.

As used in this application, the term 'circuitry' refers to all of the following:

(a) hardware-only circuit implementations (such as implementations in only analog and/or digital circuitry) and (b) to combinations of circuits and software (and/or firmware), such as: (i) to a combination of processor(s) or (ii) to portions of processor(s)/software (including digital signal processor(s)), software, and memory(ies) that work together to cause an apparatus, such as a mobile phone or server, to perform various functions and (c) to circuits, such as a microprocessor(s) or a portion of a microprocessor(s), that require software or firmware for operation, even if the software or firmware is not physically present.

This definition of 'circuitry' applies to all uses of this term in this application, including any claims. As a further example, as used in this application, the term 'circuitry' would also cover an implementation of merely a processor (or multiple processors) or portion of a processor and its (or their) accompanying software and/or firmware. The term 'circuitry' would also cover, for example and if applicable to the particular claim element, a baseband integrated circuit or applications processor integrated circuit for a mobile phone or similar integrated circuit in server, a cellular network device, or other network device.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. A method comprising:
   receiving at least two audio channel signals;
   scalar quantizing a parameter to generate an index value wherein the parameter represents a difference between the at least two audio channel signals and comprises at least one of an interaural time difference or an interaural level difference;
   determining a frequency distribution of index values by maintaining a running count of index values, wherein the running count of index values associated with past indices are weighted downwards by a recurrence factor which is less than one;
   reordering the index value dependent on the frequency distribution of index values to generate a reordered index value;
   encoding the reordered index value dependent on an order position of the reordered index value;
   generating a single channel representation of the at least two audio channel signals dependent on the at least one parameter; and
   encoding the single channel representation.

2. The method as claimed in claim 1, wherein scalar quantizing a parameter further comprises:
   ordering the scalar quantized output according to a predetermined map.

3. The method as claimed in claim 2, wherein determining a frequency distribution of index values by maintaining a running count of index values where the past indices are weighted downwards by a recurrence factor further comprises:
   receiving a group of index values;
   increasing a count value associated with a first index value; and
   decreasing a count value associated with index values other than the first index value.

4. The method as claimed in claim 1, wherein encoding the reordered index value dependent on an order position of the reordered index value comprises applying a Golomb-Rice encoding to the reordered index value dependent on the reordered index value order position.

5. A method comprising:
   decoding from a first part of a signal an index value of a parameter instance, wherein the parameter represents a difference between at least two audio channel signals and comprises at least one of an interaural time difference and an interaural level difference, and wherein the signal is an encoded multichannel audio signal;
   determining a frequency distribution of index values by maintaining a running count of index values, wherein the running count of index values associated with past indices are weighted downwards by a recurrence factor which is less than one;
   reordering the index values to generate a reordered index value, wherein the reordering is dependent on the frequency distribution of reordered index values; and
   dequantizing the reordered index value to generate the parameter.

6. The method as claimed in claim 5, wherein decoding from a first part of a signal an index of a parameter comprises decoding a first part of a signal using a Golomb-Rice decoding.

7. The method as claimed in claim 6, wherein determining the frequency distribution of the reordered index value comprises maintaining a count of the reordered index value for a group of the reordered index value.

8. The method as claimed in claim 5, wherein the reordered index value comprises:
   determining an inverse ordering dependent on a decreasing occurrence order mapping for the frequency distribution of reordered index values; and
   applying the inverse ordering.

9. An apparatus comprising at least one processor and at least one memory including computer program code for one or more programs, the at least one memory and the computer program code configured to, with the at least one processor, cause the apparatus at least to:
   receiving at least two audio channel signals;
   scalar quantize a parameter to generate an index value wherein the parameter is a difference between the at least two channel audio signals comprising at least one of an interaural time difference and an interaural level difference;
   determine a frequency distribution of index values by maintaining a running count of index values , wherein the running count of index values associated with past indices are weighted downwards by a recurrence factor which is less than one;
   reorder the index value dependent on the frequency distribution of index values to generate a reordered index value;
   encode the reordered index value dependent on an order position of the reordered index value;
   generate a single channel representation of the at least two audio channel signals dependent on the at least one parameter; and
   encode the single channel representation.

10. The apparatus as claimed in claim 9, wherein the apparatus caused to scalar quantize a parameter is further caused to:

order the scalar quantized output according to a predetermined map.

11. The apparatus as claimed in claim 10, wherein the apparatus caused to determine a frequency distribution of index values by maintaining a running count of index values where the past indices are weighted downwards by a recurrence factor further comprises:
   receive a group of index values;
   increase a count value associated with a first index value; and
   decrease a count value associated with index values other than the first index value.

12. The apparatus as claimed in claim 9, wherein the apparatus caused to encode the reordered index value dependent on an order position of the reordered index value is further caused to apply a Golomb-Rice encoding to the reordered index value dependent on the reordered index value order position.

13. An apparatus comprising at least one processor and at least one memory including computer program code for one or more programs, the at least one memory and the computer program code configured to, with the at least one processor, cause the apparatus at least to:
   decode from a first part of a signal an index value of a parameter instance, wherein the parameter represents a difference between at least two audio channel signals and comprises at least one of an interaural time difference or an interaural level difference, and, wherein the signal is an encoded multichannel audio signal;
   determine a frequency distribution of index values by maintaining a running count of index values, wherein the running count of index values associated with past indices are weighted downwards by a recurrence factor which is less than one;
   reorder the index values to generate a reordered index value, wherein the reorder is dependent on the frequency distribution of reordered index values; and
   dequantize the reordered index value to generate the parameter.

14. The apparatus as claimed in claim 13, where the apparatus caused to decode from a first part of a signal an index of a parameter comprises decoding a first part of a signal using a Golomb-Rice decoding.

15. The apparatus as claimed in claim 14, wherein the apparatus caused to determine the frequency distribution of the reordered index value is further causes to maintain a count of the reordered index value for a group of the reordered index value.

16. The apparatus as claimed in claim 13, wherein the apparatus caused to reorder index values is further caused to:
   determine an inverse ordering dependent on a decreasing occurrence order mapping for the frequency distribution of reordered index values; and
   apply the inverse ordering.

* * * * *